United States Patent [19]

Stahlhofen

[11] Patent Number: 5,017,462

[45] Date of Patent: May 21, 1991

[54] PROCESS OF PRODUCING NEGATIVE RELIEF COPIES UTILIZING PHOTOSENSITIVE COPYING MATERIAL WITH THERMAL HARDENING TRIAZINE COMPOUND

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 443,849

[22] Filed: Dec. 4, 1989

Related U.S. Application Data

[62] Division of Ser. No. 177,411, Apr. 4, 1988, abandoned.

[30] Foreign Application Priority Data

Apr. 3, 1987 [DE] Fed. Rep. of Germany ....... 3711263

[51] Int. Cl.[5] ......................... G03C 5/00; G03C 1/52; G03F 7/022; G03F 7/039

[52] U.S. Cl. .................................... 430/325; 430/330; 430/191; 430/192; 430/165; 430/270; 430/920

[58] Field of Search ............... 430/325, 330, 191, 192, 430/165, 270, 626, 920

[56] References Cited

U.S. PATENT DOCUMENTS

| | | | |
|---|---|---|---|
| 3,402,044 | 9/1968 | Steinhoff et al. | 430/192 |
| 3,645,743 | 2/1972 | Mucke et al. | 430/626 |
| 3,954,475 | 5/1976 | Bonham et al. | 430/920 |
| 4,104,070 | 8/1978 | Moritz et al. | 96/36 |
| 4,153,461 | 5/1979 | Berghäuser et al. | 96/75 |
| 4,196,003 | 4/1980 | Watanabe | 430/193 |
| 4,302,189 | 3/1982 | Taguchi et al. | 430/920 |
| 4,387,152 | 6/1983 | Stahlhofen | 430/191 |
| 4,404,272 | 9/1983 | Stahlhofen | 430/191 |
| 4,506,006 | 3/1985 | Ruckert | 430/325 |
| 4,576,901 | 3/1986 | Stahlhofen et al. | 430/325 |
| 4,581,321 | 4/1986 | Stahlhofen | 430/325 |
| 4,650,743 | 3/1987 | Galloway | 430/945 |

FOREIGN PATENT DOCUMENTS

| | | | |
|---|---|---|---|
| 565734 | 12/1987 | Australia | 430/192 |
| 164248 | 12/1985 | European Pat. Off. | 430/192 |
| 57-74417 | 8/1983 | Japan . | |
| 2082339 | 3/1982 | United Kingdom . | |

OTHER PUBLICATIONS

English Abstract of Japanese Document 58-190,946, Published 11/1983 (Sharp KK).

Dudley et al., "Cyanuric Chloride Derivatives, III--Alkoxy-s-triazines", The Journal of Am. Chem. Soc., vol. 73, 7-9/1951, pp. 2986-2992.

De Forest, W. S., *Photoresist Materials and Processes,* McGraw-Hill Book Co., 1975, pp. 47-59.

*Primary Examiner*—Charles L. Bowers, Jr.
*Assistant Examiner*—Christopher G. Young
*Attorney, Agent, or Firm*—Foley & Lardner

[57] ABSTRACT

The invention describes a photosensitive composition, a copying material prepared from this composition and the production of negative relief copies, in which a photosensitive material containing a photosensitive compound comprising an ester or an amide of a 1,2-quinonediazide sulfonic acid or carboxylic acid, a binder and an s-triazine of the general formula I

```
            N
          // \
    R2—C      C—R2
        |      ‖
        N      N
         \\   /
           C
           |
           O
           |
           R1
```

wherein $R_1$ may be an alkyl or aryl group and $R_2$ may be an alkoxy or aryloxy group or an amino group which has one or two alkyl, cycloalkyl or aryl substitutents, is exposed imagewise under a negative original, thereafter heated and, after cooling, exposed without an original or, optionally, under a positive original and then developed by means of an aqueous-alkaline developer.

7 Claims, No Drawings

PROCESS OF PRODUCING NEGATIVE RELIEF COPIES UTILIZING PHOTOSENSITIVE COPYING MATERIAL WITH THERMAL HARDENING TRIAZINE COMPOUND

This application is a division, of application Ser. No. 07/177/411, filed Apr. 4, 1988, abandoned.

BACKGROUND OF THE INVENTION

The present invention relates to a photosensitive composition substantially comprising a binder which is insoluble in water and soluble in aqueous-alkaline solutions, a photosensitive 1,2-quinonediazide or a photosensitive mixture comprising a compound which splits off acid upon exposure to light and a compound containing at least one acid-cleavable C—O—C group, and a substance which promotes thermal hardening. The invention also relates to a copying material which is prepared from a layer support and a photosensitive layer comprising the composition and to processes for the production of negative relief copies by exposing, heating, overall exposing, developing and optionally thermally post-hardening the copying material to increase the print run.

Photosensitive compositions, the imagewise exposed areas of which become soluble in a developer solution and the unexposed areas of which remain insoluble, have been known for a long time. For the preparation of such materials, layers containing o-quinonediazides as photosensitive compounds and which additionally contain resins with groups providing alkaline solubility, for example phenolic resins, are primarily used in practice.

Photosensitive compositions based on acid-cleavable compounds are also known. They contain orthocarboxylic acid derivatives, monomeric or polymeric acetals, enol ethers or acylimino carbonates as the acid-cleavable compounds. The radiation-sensitive compounds splitting off acid, which are contained in these compositions, predominantly comprise organic halogen compounds, in particular, s-triazines substituted by methyl halide groups. The binders used also comprise resins with groups providing alkaline solubility.

It is also known that a normally positive-working copying material based on o-quinonediazides can be used for negative processing in the presence of appropriate additives and by a particular sequence of treatments. British Patent Application No. 2 082 339 describes a reversal process of this kind, in which a photosensitive mixture comprising an o-quinonediazide and at least one resol can be employed as a negative-working recording material. German Offenlegungsschrift No. 25 29 054 (corresponding to U.S. Pat. No. 4,104,070) describes resist layers based on 1,2-quinonediazides for use in a reversal process. These layers contain a hydroxyethylimidazoline as an additive. A similar material containing secondary or tertiary amines is disclosed in U.S. Pat. No. 4,196,003. European Patent Application No. 0 133 216 (corresponding to U.S. Pat. No. 4,581,321) describes a reversal process, in which the o-quinonediazide-containing copying layer contains an additive comprising a hexamethylolmelamine ether which is preferably used as a crosslinking agent in polymer reactions, while European Patent Application No. 0 131 238 (corresponding to U.S. Pat. No. 4,576,901) discloses a reversal process, in which the photosensitive material does not require any of the above-indicated basic or acidic additives.

There has also been disclosed a positive-negative reversal process on a basis of acid-cleavable compounds instead of 1,2-quinonediazides, as described in European Patent Application No. 0 082 463 (corresponding to U.S. Pat. No. 4,506,006).

The above-described reversal processes basically comprise the same sequence of processing steps, including heating the printing plate after imagewise exposure, re-exposing the cooled plate without an original and then developing by means of an aqueous-alkaline developer.

These reversal processes are based on the fact that the photodecomposition products produced form an insoluble reaction product when they are heated. This thermal hardening preferably takes place in the presence of particular basic or acidic additives in the copying layer or in the presence of particular crosslinking agents containing multifunctional reactive groups.

Additives of this kind, however, usually have an adverse influence on the shelf life of the copying material and on particular properties relating to copying technique, for example, photosensitivity and image contrast after exposure. In addition, for many applications the temperature required for image reversal is too high, or the duration of heating at a relatively low temperature is too long, or the reversal range is too narrow.

In the reversal process described in European Patent Application No. 0 133 216, the copying layer contains, in addition to a 1,2-quinonediazide, an ether of hexamethylolmelamine as an essential constituent, as mentioned above. Although such melamine ethers advantageously promote the image reversal of a normally positive-working photosensitive material during thermal treatment in the exposed image areas, the hexamethylolmelamine ethers nevertheless have the disadvantage that the temperature tolerances of the reversal range are relatively narrow, which may give rise to varying copying results. It is also a significant disadvantage that, owing to the reactive —$CH_2$—O—R— groups of the additional compound, the printing plates have a poor shelf life, in particular at elevated temperatures, which leads to premature crosslinking and thus renders the plates useless.

SUMMARY OF THE INVENTION

It is therefore an object of the present invention to provide a photosensitive composition, a copying material prepared from this composition and a reversal process performed by means of the material so prepared, which does not have the above-indicated disadvantages, but possesses a good shelf life, even at elevated temperature, and shows a relatively wide thermal-treatment range.

In accordance with these and other objects, the invention provides a photosensitive composition comprising a binder which is insoluble in water and soluble in aqueous-alkaline solutions, a photosensitive 1,2-quinonediazide or a photosensitive mixture comprising a compound which splits off acid upon exposure to light and a compound containing at least one acid-cleavable C—O—C group, and a thermal-hardening substance comprising a compound of the general formula I

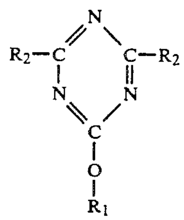

wherein $R_1$ may be an alkyl or aryl group and $R_2$ may be an alkoxy or aryloxy group or an amino group which has one or two alkyl, cycloalkyl or aryl substituents.

The substance promoting thermal hardening preferably comprises a compound of the general formula I, wherein $R_1$ may be a ($C_1$–$C_4$)-alkyl or phenyl group and $R_2$ may be a ($C_1$–$C_4$)-alkoxy or phenoxy group or an amino group which has one or two ($C_1$–$C_4$)-alkyl or ($C_4$–$C_8$)-cycloalkyl substituents.

It has proved particularly advantageous to use 2-dialkylamino-4,6-dialkoxy-s-triazine.

DESCRIPTION OF THE PREFERRED EMBODIMENTS

It is a great advantage that, during the positive-negative reversal step, the symmetrical triazines used according to the invention impart high stability against undesired temperature influences to the photosensitive composition and the copying material prepared therefrom. This results in a relatively wide reversal range during heat-treatment, without prejudicing tonal rendering, even in the case of temperature variations in the reversal step. The procedure followed in the production of printing forms is thus considerably facilitated.

The preparation of the s-triazines used according to the present invention is described, for example, in "The Journal of the American Chemical Society", Vol. 73 (1951), pages 2986–2992.

The concentration of the symmetrical triazines used in the photosensitive composition may vary within relatively wide limits. They are generally present in a proportion of from about 0.5% to 30% by weight, preferably from about 1% to 15% by weight, based on the weight of the non-volatile constituents of the photosensitive composition.

Sensitizers which are suitable for use in the composition of the present invention and the copying material prepared therefrom, respectively, comprise any 1,2-quinonediazide-sulfonic-acid esters, 1,2-quinonediazide-sulfonic-acid amides, 1,2-quinonediazide-carboxylic-acid esters and amides, which are rendered soluble in aqueous-alkaline solutions by exposure to actinic radiation. These include the reaction products of 1,2-benzoquinone or 1,2-naphthoquinonediazide-4- or -5-sulfonic acid or of the acid chlorides thereof with phenol-aldehyde/acetone condensation products or with polymers of p-hydroxystyrene, p-aminostyrene or copolymers of these two compounds. The 1,2-quinonediazide-sulfonic-acid-4-esters are particularly useful sensitizers.

Suitable esters of the 1,2-quinonediazide derivatives include the well-known reaction products of the acids or their halides with phenols, in particular, polyhydric phenols, for example with 2,3,4-trihydroxybenzophenone, 2,4-dihydroxy-benzophenone, 4-decanoylresorcinol, 4-(2-phenylprop-2-yl)-phenol, gallic acid octylester, or 4,4-bis-(4-hydroxyphenyl)-valeric acid butylester. The esterification product of 1 mole of 4-(2-phenylprop-2-yl)-phenol and 1 mole of 1,2-naphthoquinone-2-diazide-4-sulfonic acid chloride has proved particularly advantageous for use according to the present invention.

The quantity of o-quinonediazide compounds generally ranges from about 3% to 50% by weight, preferably from about 7% to 35% by weight, based on the weight of the non-volatile constituents of the copying layer.

A great number of known compounds and mixtures, such as phosphonium, sulfonium and iodonium salts, halogen compounds and organometal/organohalogen combinations, are suitable for use as the photosensitive components which form strong acids upon exposure to light.

As a rule, the above-mentioned phosphonium, sulfonium and iodonium compounds are used in the form of their salts which are soluble in organic solvents, usually as a precipitate with complex acids, for example, tetrafluoroboric acid, hexafluorophosphoric acid, hexafluoroantimonic acid and hexafluoroarsenic acid.

As the halogen-containing photosensitive compounds which form hydrohalogenic acid any organic halogen compounds can basically be used, which are also known as photochemical free-radical initiators, for example, those which have more than one halogen atom on a carbon atom or on an aromatic ring. Examples are described in U.S. Pat. No. 3,515,552; No. 3,536,489 and No. 3,779,778, in German Patent No. 26 10 842 and in German Offenlegungsschriften No. 22 43 621; No. 27 18 259 and No. 33 37 024. Of these compounds, the s-triazine derivatives are preferred, which contain 2 methyl halide groups, in particular trichloromethyl groups, and an aromatic or unsaturated substituent, respectively, in the triazine nucleus, as described in German Offenlegungsschriften No. 27 18 259 and No. 33 37 024. The 2-trichloromethyl-1,3,4-oxadiazoles described in German Offenlegungsschriften No. 28 51 471 and No. 28 49 396 are likewise well suited. The effect of these halogen-containing compounds can also be spectrally influenced and enhanced by known sensitizers.

Examples of suitable initiators are:

4-methyl-6-trichloromethyl-2-pyrone,
4-(3,4,5-trimethoxystyryl)-6-trichloromethyl-2-pyrone,
4-(4-methoxystyryl)-6-(3,3,3-trichloropropenyl)-2-pyrone,
2-trichloromethylbenzimidazole,
2-tribromomethylquinoline,
2,4-dimethyl-1-tribromoacetylbenzene,
3-nitro-1-tribromoacetylbenzene,
4-dibromoacetyl-benzoic acid,
1,4-bis-dibromomethylbenzene,
tris-dibromomethyl-s-triazine,
2-(6-methoxy-naphth-2-yl)-,
2-(naphth-1-yl)-,
2-(naphth-2-yl)-,
2-(4-ethoxyethyl-naphth-1-yl)-,
2-(benzopyran-3-yl)-,
2-(4-methoxyanthrac-1-yl)-,
2-(4-styrylphenyl)-, and
2-(phenanthr-9-yl)-4,6-bis-trichloromethyl-s-triazine,
and the compounds specified in the examples.

The quantity of initiator used can also vary widely depending on its chemical nature and on the composition of the layer. Favorable results are obtained using from about 0.5% to 20% by weight, preferably from about 1.0% to 12% by weight, based on total solids. In particular in photosensitive layers having thicknesses over 0.01 mm it is advisable to use a relatively small amount of acid donor.

Acid-cleavable compounds which may be mentioned include:

A) Compounds containing at least one orthocarboxylic acid ester and/or carboxylic acid amide acetal moiety; the compounds can also have a polymeric character and the moities mentioned can be present as linking members in the principal chain or as lateral substituents.

B) Oligomeric or polymeric compounds containing recurrent acetal and/or ketal moieties in the principal chain.

C) Compounds containing at least one enol ether or N-acyliminocarbonate moiety.

Acid-cleavable compounds of type (A) used as components of photosensitive compositions are described in detail in U.S. Pat. No. 4,101,323 and in European Patent Application No. 0 022 571; compositions containing compounds of type (B) are described in German Patents No. 23 06 248 and No. 27 18 254 and in U.S. Pat. No. 3,779,778; and compounds of type (C) are described in European Patent Applications No. 0 006 626 and No. 0 006 727.

The proportion of cleavable compound used may be varied between about 4% and 50% by weight; preferred is a quantity of from about 5% to 30% by weight.

The photosensitive compositions preferably also contain a polymeric, water-insoluble resinous binder, which dissolves in the solvents used for the compositions and is also soluble or at least swellable in aqueous alkalis.

The novolac condensation resins which are widely used in many positive copying materials based on naphthoquinonediazides have also proved advantageous for use as binders in the present invention. The novolacs can also be modified in a known manner, by reacting part of their hydroxy groups with, for example, chloroacetic acid, isocyanates, epoxides, or carboxylic acid anhydrides. Further preferred binders which are soluble or swellable in alkali include polyhydroxyphenol resins prepared by condensation of phenols with aldehydes or ketones, copolymers of styrene and maleic anhydride, polyvinylphenols, or copolymers of acrylic acid or methacrylic acid, in particular with acrylic or methacrylic acid phenolesters. The type and quantity of the binders used may vary depending on the intended application; preference is given to quantities ranging between about 90% and 30% by weight, in particular between about 85% and 55% by weight, based on total solids.

A great number of other resins can additionally be employed, preferably epoxy resins and vinyl polymers, such as polyvinyl acetates, polyacrylates, polyvinyl acetals, polyvinyl ethers, polyvinylpyrrolidones, and the copolymers of the monomers on which these resins are based and also hydrogenated or partially hydrogenated colophony derivatives. The most favorable proportion of these resins depends on application related requirements and on their influence on development conditions, it generally does not exceed about 50% by weight, and is preferably from about 2% to 35% by weight, of the binder. To meet special requirements, such as flexibility, adhesion, gloss and coloration, the photosensitive composition can also contain substances, such as polyglycols, cellulose derivatives, e.g., ethyl cellulose, wetting agents, dyes, adhesion promoters and finely divided pigments and, if required, UV absorbers.

To effect color change after exposure, the photosensitive composition can also be admixed with small amounts of radiation-sensitive components which preferably form or split off strong acids upon exposure and cause a color change in a subsequent reaction with a suitable dye. Such radiation-sensitive components include, for example, 1,2-naphthoquinone-diazide-4-sulfonic acid chloride, bis- or trishalogenomethyl-s-triazines containing chromophoric substituents, diazonium compounds in the form of their salts with complex acids, such as tetrafluoroboric acid or hexafluorophosphoric acid, or 4-dialkoxyaminoazobenzenes.

Particularly preferred photosensitive compositions contain 2-dialkylamino-4,6-dialkoxy-s-triazine, 1,2-naphthoquinone-2-diazide-4-sulfonic acid ester, 4-dialkylaminoazobenzene or 2,4-bis-trihalogenomethyl-s-triazine and a triphenyl methane dye.

The invention also provides a photosensitive copying material comprising a layer support and a photosensitive layer substantially comprising a binder which is insoluble in water and soluble in aqueous-alkaline solutions, a photosensitive 1,2-quinonediazide or a photosensitive mixture comprising a compound which splits off acid upon exposure to light and a compound containing at least one acid-cleavable C—O—C— group, and a substance which promotes thermal hardening. The copying material is characterized in that it contains at least one of the above-described compounds as the substance which promotes thermal hardening.

For coating a suitable layer support, the compositions are usually dissolved in a solvent. The selection of solvents depends on the intended coating process, the layer thickness and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as ethylene glycol monoethyl ether; and esters, such as butyl acetate. It is also possible to use mixtures which, for special purposes, may additionally contain solvents, such as acetonitrile, dioxane or dimethyl formamide. In principle any solvents can be used which do not irreversibly react with the layer components. Partial ethers of glycols, in particular ethylene glycol monomethyl ether and propylene glycol methyl ether are particularly preferred.

In most cases, the supports used for layer thicknesses of less than about 10 μm are metals. The following can be used for offset printing plates: mill-finished, mechanically or electrochemically grained and optionally anodically oxidized aluminum, which additionally may have been chemically pretreated, for example, with polyvinylphosphonic acid, silicates, phosphates, hexafluorozirconates or with hydrolyzed tetraethyl orthosilicate.

Coating of the layer support is carried out in a known manner by means of spin-coating, spraying, dipping, roller-coating, application with slot dies, blade-spreading or flow-coater application.

For exposure, customary light sources are used.

The invention also relates to processes for the production of negative relief copies, in which a photosensitive copying material comprising a layer support with a photosensitive layer substantially comprising a binder which is insoluble in water and soluble in aqueous-alkaline solutions, a photosensitive 1,2-quinonediazide or a photosensitive mixture comprising a compound which splits off acid upon exposure to light and a compound containing at least one acid-cleavable C—O—C— group, and a substance which promotes thermal hardening, is exposed imagewise, thereafter heated and, after cooling, subjected to an overall exposure and is then developed by means of an aqueous-alkaline developer. The process is characterized in that at least one of the above-described compounds is used as the substance which promotes thermal hardening.

In a modification, the process is also suitable for the production of relief copies which reproduce negative as well as positive images. For this purpose, the copying material is exposed imagewise under a negative original, thereafter heated and, after cooling, exposed under a positive original in the areas not yet subjected to imagewise exposure, and is then developed by means of an aqueous-alkaline developer.

For the reversal treatment, the copying material is, after imagewise irradiation or exposure under a negative original, heated without any further intermediate treatment. Heating can be effected by irradiation, convection, contact with heated surfaces, for example, rolls, or by immersion in a heated bath comprising an inert liquid, for example, water. The heating temperature ranges between about 80° and 150° C., in particular, between about 100° and 130° C. These temperatures are tolerated by the compositions of the present invention without any significant change in the properties of the unexposed areas. The duration of heating the copying material can vary widely, depending on the method chosen for the application of heat. If a heat-transferring medium is used, the heating time ranges between about 10 seconds and 10 minutes, in particular between about 1 and 3 minutes.

Following heating and cooling, the printing plate is subjected to overall exposure, in order to completely convert the still photosensitive layer areas into their photodecomposition products. For re-exposure, the light source used in the imagewise exposure can advantageously be used again.

Re-exposure is followed by developing with customary developers. In the process, the layer areas which were not struck by light in the original imagewise exposure are washed off. Suitable developers preferably comprise aqueous solutions of alkaline substances having a graduated alkalinity, for example, of alkali-metal phosphates, silicates, carbonates, or hydroxides. The pH range is usually between about 10 and 14. The developer additionally contains surfactants or minor amounts of organic solvents. In particular cases, suitable developers also comprise organic solvents or mixtures of organic solvents with water. The material can be developed either immediately after heating and cooling, or after a time interval of, for example, several hours, without any attack occurring in the hardened layer areas.

To increase the print run, a customary thermal post-hardening treatment can additionally be carried out.

The copying material of the present invention has a good shelf life, even at elevated temperature. The imagewise exposed layer areas are relatively quickly hardened under the action of heat; the heating temperature required for the reversal step is lower and the dwell time at elevated temperature is considerably shorter than in the materials known in the art.

It is also an advantage of the process of the invention that, in the presence of the symmetrical triazines used according to the present invention in the copying layer, temperature tolerances of the reversal range are relatively large, such that tonal rendering is not adversely influenced, even in the case of considerable temperature variations during the reversal step.

As already mentioned, the copying materials of the present invention can be used for the production of a negative copy from the normally positive-working copying layer and they can moreover advantageously be used to materialize various possibilities of combining line and screen films by exposing them together on the same plate (photocomposing). Immediately after the first imagewise exposure under a negative original, for example the layer areas not yet struck by light, i.e., which were covered by a mask during the first exposure, can be subsequently exposed under a further line or screen image, with the aid of a positive original. The printing plate thus exposed is then developed without any further intermediate steps. In this manner the final printing form is obtained.

Additional treatment steps in which liquids are used, or a special composition of the photosensitive material are not required. The only additional treatment step, i.e., heating, can usually easily be carried out with the aid of existing drying apparatus. The last exposure without an original is most simply performed with the light source used for imagewise exposure.

The process of the present invention can, for example, be used in the production of printing forms for letterpress, gravure and planographic printing, in the production of photoresist stencils for the subtractive and additive preparation of printed circuit boards, in the production of nickel screen-printing cylinders prepared by an electroplating process, and in the production of masks in microelectronics, according to the lift-off technique.

In the examples which follow, preferred embodiments of the process according to the present invention are described. Percentages and quantitative ratios are to be understood as units of weight, unless otherwise specified.

EXAMPLE 1

An electrolytically grained and anodically oxidized aluminum sheet was coated with a solution of 1.70 parts by weight of the esterification product of 1 mole of 4-(2-phenylprop-2-yl)phenol and 1 mole of 1,2-naphthoquinone-2-diazide-4-sulfonic acid chloride, 0.60 part by weight of 2-diethylamino-4,6-diethoxy-s-triazine, 8.50 parts by weight of a cresol-formaldehyde novolac having a softening range from 127° to 145° C., 0.40 part by weight of 2,4-dihydroxybenzophenone, 0.06 part by weight of 2,4-bis-trichloromethyl-6-p-stilbenyl-s-triazine, 0.07 part by weight of Crystal Violet, Colour Index (C.I.) 42,555, in 70.00 parts by weight of ethylene glycol monomethyl ether, and 70.00 parts by weight of tetrahydrofuran.

Before applying the photosensitive copying layer, the anodically oxidized aluminum support had been treated with an aqueous solution of polyvinyl phosphonic acid, as described in German Patent No. 16 21 468 (corresponding to U.S. Pat. No. 4,153,461).

The presensitized copying material prepared in this manner, in which the photosensitive layer had a dry layer weight of about 2.3 $g/m^2$ was exposed imagewise under a transparent positive original and then developed with a 4% strength aqueous solution of sodium silicate. In the developing procedure, the portions of the copying layer which had been struck by light were removed and the unexposed image areas remained on the layer support, such that a printing stencil corresponding to the original was obtained. Inking with a greasy printing ink yielded a positive printing form which was ready for printing.

Another sample of the same presensitized copying material was processed to give a negative printing plate. For this purpose, the sample was exposed under a negative original, thereafter heated for two minutes at 120° C. and then re-exposed without an original, for the same exposure time as used in the imagewise exposure. Upon developing in the same developer for the same period of time as used above, a reversed image of the original was obtained.

It is also possible to process the material according to the photocomposing method, i.e., by the subsequent exposure under line or screen originals onto a printing plate which has already been exposed imagewise. For this purpose the printing plate prepared is first exposed imagewise under a negative original as indicated above, thereafter heated for two minutes at 120° C., and then again exposed under a diapositive, in the layer areas not yet struck by light. The printing plate repeatedly exposed in this manner is developed without any further intermediate steps and, as a result, the final printing form is obtained.

As compared with the hitherto known reversal plates and processes, the present invention offers the great advantage of a relatively large treatment range during the heating step. This becomes apparent when the normally positive-working photosensitive printing plate prepared is exposed imagewise under a negative original, in the presence of a test wedge as customarily used in the imagewise exposure of offset printing plates, for example, the UGRA-Offset-Test Wedge 1982, and is thereafter subjected to the heating step required for image reversal.

When the imagewise exposed printing plate is, for example, heated for two minutes, the temperature can be varied between about 80° and 150° C., without giving rise to any visible change in the test image resulting after the subsequent overall re-exposure and development. This large temperature tolerance of the actual reversal step during processing is very desirable in practice, since properties relating to copying technique, such as the tonal rendering, are not adversely influenced, even in the case of relatively wide temperature variations, which may occur in the heating ovens or automatic converting apparatus used in practice.

If the 2-diethylamino-4,6-diethoxy-s-triazine used according to the present invention is, for example, replaced by the same quantity of a hexamethylol melamine hexamethyl ether according to European Patent Application No. 0 133 216 and after imagewise exposure under the same test original, the heat-treatment step is likewise carried out for two minutes, the resulting temperature range is only about 20° C.

The excellent shelf life of the copying material according to the present invention becomes apparent when the printing plate prepared is subjected to a storage test at 100° C. The printing plate of the present invention, which has been stored for four hours at 100 ° C. and then exposed imagewise can still be perfectly developed, while a corresponding printing plate containing hexamethylol melamine hexamethyl ether, which has been exposed imagewise after having been stored for only 45 seconds at 100 ° C., can no longer be faultlessly developed.

In the following examples further coating solutions are specified, which yield results similar to those indicated in Example 1. Unless specifically mentioned, preparation and processing of the printing plates obtained with these coating solutions are carried out under the conditions described in Example 1. The exposed printing plates are developed, in each case, with a 4% or 5% strength aqueous solution of sodium metasilicate.

EXAMPLE 2

The coating solution comprises:

1.60 parts by weight of the esterification product of 1 mole of 4-(2-phenylprop-2-yl)phenol and 1 mole of 1,2-naphthoquinone-2-diazide-4-sulfonic acid chloride, 0.90 part by weight of 2,6-bis-(diethylamino)-4-methoxy-s-triazine, 8.60 parts by weight of a cresol-formaldehyde novolac having a softening range from 127° to 145° C., 0.08 part by weight of 2,4-bis-trichloromethyl-6-p-stilbenyl-s-triazine, 0.40 part by weight of 2,3,4-trihydroxybenzophenone, 0.07 part by weight of Crystal Violet in, 60.00 parts by weight of propylene glycol monomethyl ether, and 80.00 part by weight of tetrahydrofuran.

EXAMPLE 3

The coating solution comprises:

1.70 parts by weight of the esterification product of 1 mole of 4-(2-phenylprop-2-yl)-2,6-dibromophenol and 1 mole of 1,2-naphthoquinone-2-diazide-4-sulfonic acid chloride, 0.70 part by weight of 2-diethylamino-4,6-diphenoxy-s-triazine, 9.00 parts by weight of a cresol-formaldehyde novolac having a softening range from 127° to 145° C., 0.05 part by weight of 2,4-bis-trichloromethyl-6-p-methoxystyryl-s-triazine, 0.07 part by weight of Crystal Violet in 70.00 parts by weight of propylene glycol monomethyl ether, and 70.00 parts by weight of tetrahydrofuran.

EXAMPLE 4

The coating solution comprises:

1.60 parts by weight of the esterification product of 1 mole of 2,2'-dihydroxydinaphthyl-(1,1')-methane and 2 moles of 1,2-naphthoquinone-2-diazide-4-sulfonic acid chloride, 0.70 part by weight of 2-(methylcyclohexyl)-amino-4,6-dimethoxy-s-triazine, 8.60 parts by weight of a cresol-formaldehyde novolac having a softening range from 127° to 145° C., 0.06 part by weight of 2,4-bis-trichloromethyl-6-p-stilbenyl-s-triazine, 0.40 part by weight of 2,4-dihydroxybenzophenone, 0.07 part by weight of Crystal Violet in 60.00 parts by weight of ethylene glycol monomethyl ether, and 80.00 parts by weight of tetrahydrofuran.

EXAMPLE 5

The coating solution comprises:

1.60 parts by weight of the esterification product of 1 mole of 4-(2-phenylprop-2-yl)-2,6-dibromophenol and 1 mole of 1,2-naphthoquinone-2-diazide-4-sulfonic acid chloride,
1.20 parts by weight of 2,4,6-trimethoxy-s-triazine,
8.40 parts by weight of a cresol-formaldehyde novolac having a softening range from 127° to 145° C.,
0.08 part by weight of 2,4-bis-trichloromethyl-6-p-methoxystyryl-s-triazine,
0.30 part by weight of 2,4-dihydroxybenzophenone,
0.07 part by weight of Crystal Violet in
60.00 parts by weight of ethylene glycol monomethyl ether, and
80.00 parts by weight of tetrahydrofuran.

EXAMPLE 6

The coating solution comprises:

1.70 parts by weight of the esterification product of 1 mole of 2,3,4-trihydroxybenzophenone and 3 moles of 1,2-naphthoquinone-2-diazide-4-sulfonic acid chloride,
0.80 part by weight of 2-diethylamino-4,6-diethoxy-s-triazine,
8.60 parts by weight of a cresol-formaldehyde novolac having a softening range from 127° to 145 ° C.,
0.08 part by weight of 2,4-bis-trichloromethyl-6-p-methoxystyryl-s-triazine,
0.07 part by weight of Crystal Violet in
70.00 parts by weight of propylene glycol monomethyl ether, and
70.00 parts by weight of tetrahydrofuran.

EXAMPLE 7

The coating solution comprises:

1.60 parts by weight of the esterification product of 1 mole of 2,2-bis-(4-hydroxyphenyl)-propane and 2 moles of 1,2-naphthoquinone-2-diazide-4-sulfonic acid chloride,
1.00 part by weight of 2,4,6-triphenoxy-s-triazine,
8.40 parts by weight of a cresol-formaldehyde novolac having a softening range from 127° to 145° C.,
0.08 part by weight of 2,4-bis-trichloromethyl-6-p methoxystyryl-s-triazine,
0.07 part by weight of Crystal Violet in
50.00 parts by weight of N,N-dimethylformamide, and
90.00 parts by weight of ethylene glycol monomethyl ether.

EXAMPLE 8

An electrolytically grained and anodically oxidized aluminum sheet was coated with a solution of:

1.40 parts by weight of a polyorthoester prepared from 7,7-bis-hydroxymethyl-5-oxa-nonanol-(1) and trimethyl orthoformate,
0.22 part by weight of 2,4-bis-trichloromethyl-6-p-stilbenyl-s-triazine,
0.14 part by weight of 2-diethylamino-4,6-diethoxy-s-triazine,
4.70 parts by weight of the novolac specified in Example 1,
0.04 part by weight of Crystal Violet base in
35.00 parts by weight of propylene glycol monomethyl ether, and
45.00 parts by weight of tetrahydrofuran.

The presensitized copying material thus prepared, in which the photosensitive layer had a dry layer weight of about 2.0 g/m$^2$, was exposed imagewise under a transparent positive original for 10 exposure units with the aid of a 500 watt metal halide lamp arranged at a distance of 103 cm and was then developed with a 4% strength aqueous solution of sodium silicate. In the developing procedure the portions of the copying layer which had been struck by light were removed and the unexposed image areas remained on the layer support, such that a printing stencil corresponding to the original was obtained. Inking with a greasy printing ink yielded a positive printing form which was ready for printing.

Another sample of the same presensitized material was processed to give a negative printing plate. For this purpose, the sample was exposed under a negative original for 10 exposure units, thereafter heated for two minutes at 130° C. and then re-exposed for 10 exposure units without an original. Upon developing in the same developer for the same period of time as used above, a reversed image of the original was obtained.

EXAMPLE 9

An electrolytically grained and anodically oxidized aluminum sheet was coated with a solution of:

1.80 parts by weight of the esterification product of 1 mole of 4-(2-phenylprop-2-yl)phenol and 1 mole of 1,2-naphthoquinone-2-diazide-4-sulfonic acid chloride,
0.85 part by weight of 2-diethylamino-4,6-diethoxy-s-triazine,
7.00 parts by weight of a cresol-formaldehyde novolac having a softening range from 127° to 145° C.,
1.00 part by weight of a cresol-formaldehyde novolac having a softening range from 115° to 125° C.,
0.40 part by weight of bis-(4-hydroxyphenyl)-sulfone,
0.04 part by weight of diethylaminoazobenzene (Sudan Yellow GGN, Colour Index No. 11,021),
0.14 part by weight of Victoria Pure Blue FBO in
70.00 parts by weight of ethylene glycol monomethyl ether, and
70.00 parts by weight of tetrahydrofuran.

Before applying the photosensitive copying layer the anodically oxidized aluminum support had been treated with an aqueous solution of polyvinyl phosphonic acid, as described in German Patent No. 16 21 468 (corresponding to U.S. Pat. No. 4,153,461).

The presensitized copying material prepared in this manner, in which the photosensitive layer had a dry layer weight of about 2.3 g/m$^2$ was exposed imagewise under a transparent positive original and then developed with a 4% strength aqueous solution of sodium silicate. In the developing procedure, the portions of the copying layer which had been struck by light were removed and the unexposed image areas remained on the layer support, such that a printing stencil corresponding to the original was obtained. Inking with a greasy printing ink yielded a positive printing form which was ready for printing.

Another sample of the same presensitized material was processed to give a negative printing plate. For this purpose, the sample was exposed under a negative original in the presence of a continuous-tone step wedge, thereafter heated for two minutes at 120° C. and then re-exposed without an original for the same exposure time as used for imagewise exposure. Upon developing in the same developer for the same period of time as used above, a reversed image of the original was obtained.

The resulting relatively wide reversal range, i.e., the range between the lower temperature, at which the heat-treated layer areas have been rendered just resistant to the developer, and the upper temperature, at which properties which are disadvantageous with respect to copying technique begin to show, can be demonstrated by varying the temperature in the heating step of the imagewise exposed printing plate between about 80° and 150° C. during a period of two minutes. After the subsequent overall re-exposure and development no essential change is discernible either in the test image or, in particular, in a continuous-tone step wedge exposed together with the test image. This large temperature tolerance of the reversal step is a great advantage in view of processing in practice.

The same result is obtained when the printing plate prepared according to Example 10 below is processed in a corresponding manner.

EXAMPLE 10

1.80 parts by weight of the esterification product of 1 mole of 4-(2-phenylprop-2-yl)phenol and 1 mole of 1,2-naphthoquinone-2-diazide-4-sulfonic acid chloride,
0.85 part by weight of 2-diethylamino-4,6-diethoxy-s-triazine,
6.00 parts by weight of a copolymer of styrene and brenzcatechin methacrylic acid ester, in a molar ratio of 30:70,
1.50 parts by weight of a cresol-formaldehyde novolac having a softening range from 115° to 125° C.,
0.70 part by weight of bis-(4-hydroxyphenyl)sulfone,
0.04 part by weight of diethylaminoazobenzene,
0.15 part by weight of Victoria Pure Blue FBO in
70.00 parts by weight of ethylene glycol monomethyl ether, and
70.00 parts by weight of tetrahydrofuran.

What is claimed is:

1. A process for the production of negative relief copies, in which a photosensitive copying material comprising a layer support and a photosensitive layer comprising a binder which is insoluble in water and soluble in aqueous-alkaline solutions, a photosensitive 1,2-quinone-diazide or a photosensitive mixture comprising a compound which splits off acid upon exposure to light and a compound containing at least one acid-cleavable C—O—C group, and a thermal-hardening substance, is exposed imagewise to actinic radiation to produce a latent positive image, thereafter heated to about 80° to 150° C. to thermally harden exposed areas, cooled, and, after cooling, subjected to an overall exposure to actinic radiation to produce a latent negative relief image which is then developed by means of an aqueous-alkaline developer, wherein the thermal-hardening substance comprises at least one compound of the general formula I

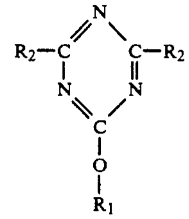

wherein $R_1$ may be alkyl or aryl group and $R_2$ may be an alkoxy or aryloxy group or an amino group which has one or two alkyl, cycloalkyl or aryl substituents, and wherein the photosensitive compound or mixture is present in an amount sufficient to render exposed areas soluble in developer and the thermal-hardening substance is present in an amount sufficient to cause hardening of exposed areas under the action of heat.

2. A process as claimed in claim 1, wherein the imagewise exposed material is heated for about 10 seconds to 10 minutes.

3. A process as claimed in claim 1, wherein, for producing negative and positive copies on the same copying layer, the material is, after cooling, exposed imagewise in the still unexposed, previously covered layer areas with the aid of additional originals and is then developed by means of an aqueous-alkaline developer.

4. A process as claimed in claim 1, wherein $R_1$ may be a ($C_1$–$C_4$) -alkyl or phenyl group and $R_2$ may be an ($C_1$–$C_4$)-alkoxy or phenyl group or an amino group which has one or two ($C_1$–$C_4$)-alkyl or ($C_4$–$C_8$)-cycloalkyl substituents.

5. A process as claimed in claim 1, wherin the thermal-hardening substance comprises 2-dialkylamino-4,6-dialkoxy-s-triazine.

6. A process as claimed in claim 1, wherein the photosensitive layer comprises 2-dialkylamino-4,6-dialkoxy-s-triazine, 1,2-naphthoquinone-2-diazide-4-sulfonic acid ester, 4-dialkylaminoazobenzene and a triphenyl methane dye.

7. A process as claimed in claim 1, wherein the photosensitive layer comprises 2-dialkylamino-4,6-dialkoxy-s-triazine, 1,2-naphthoquinone-2-diazide-4-sulfonic acid ester, 2,4-bis-trihalogenomethyl-s-triazine and a triphenyl methane dye.

* * * * *